(12) United States Patent
Kasper et al.

(10) Patent No.: US 6,941,080 B2
(45) Date of Patent: Sep. 6, 2005

(54) METHOD AND APPARATUS FOR DIRECTLY MODULATING A LASER DIODE USING MULTI-STAGE DRIVER CIRCUITRY

(75) Inventors: Bryon Lynn Kasper, San Marino, CA (US); Eva Peral, Pasadena, CA (US); Johannes G. Ransijn, Wyomissing Hills, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 69 days.

(21) Appl. No.: 10/195,662

(22) Filed: Jul. 15, 2002

(65) Prior Publication Data

US 2004/0208207 A1 Oct. 21, 2004

(51) Int. Cl.[7] .............................................. H04B 10/04
(52) U.S. Cl. ....................... 398/186; 398/182; 398/183; 398/192; 398/193; 398/194; 398/195; 372/33; 372/34; 372/35; 372/36; 372/38; 372/29
(58) Field of Search ................................ 398/186, 182, 398/183, 192, 193, 194, 195; 372/33, 34, 36, 38, 32, 35, 29, 38.01, 38.02

(56) References Cited

U.S. PATENT DOCUMENTS

| | | |
|---|---|---|
| 4,237,427 A | 12/1980 | Holland |
| 4,243,951 A | 1/1981 | Wolkstein et al. |
| 4,505,582 A | 3/1985 | Zuleeg et al. |
| 4,594,717 A | 6/1986 | Bracht et al. |
| 4,698,817 A * | 10/1987 | Burley ........................ 372/31 |
| 4,736,380 A | 4/1988 | Agoston |
| 4,819,241 A | 4/1989 | Nagano |
| 4,835,782 A | 5/1989 | Kaede et al. |
| 4,849,981 A * | 7/1989 | Toda ......................... 333/24 R |
| 4,945,542 A | 7/1990 | Brothers, Jr. |
| 5,097,473 A | 3/1992 | Taguchi |
| 5,268,916 A | 12/1993 | Slawson et al. |
| 5,488,621 A | 1/1996 | Slawson et al. |
| 5,521,933 A | 5/1996 | Sosa |
| 5,604,759 A | 2/1997 | Miyaki et al. |
| 5,646,763 A | 7/1997 | Misaizu et al. |
| 5,651,017 A | 7/1997 | Genovese |
| 5,739,938 A * | 4/1998 | Goutzoulis et al. ......... 398/197 |
| 5,850,409 A | 12/1998 | Link |
| 5,946,334 A | 8/1999 | Ema et al. |
| 5,970,078 A | 10/1999 | Walker |
| 6,044,097 A * | 3/2000 | Kawamura et al. ...... 372/38.01 |
| 6,118,798 A | 9/2000 | Ema et al. |
| 6,249,621 B1 | 6/2001 | Sargent, IV et al. |
| 6,609,842 B1 * | 8/2003 | Kimbrough ................. 398/195 |
| 6,618,407 B1 * | 9/2003 | Andrews et al. ......... 372/38.02 |
| 6,667,661 B1 * | 12/2003 | Liu et al. ..................... 330/311 |
| 6,748,181 B2 * | 6/2004 | Miki et al. .................. 398/195 |

* cited by examiner

*Primary Examiner*—Hanh Phan
(74) *Attorney, Agent, or Firm*—Christie Parker & Hale

(57) ABSTRACT

An optical transmitter includes a laser driver capable of receiving data and applying the data to drive a laser diode over a transmission line having first and second ends. The first end of the transmission line is coupled to an output of the laser driver. A first terminal of an amplifier is coupled to the second end of the transmission line. A second terminal of the amplifier is coupled to the laser diode. The signal amplitude applied at the first terminal controls optical output amplitude of the laser diode.

12 Claims, 4 Drawing Sheets

METHOD AND APPARATUS FOR DIRECTLY MODULATING A LASER DIODE USING MULTI-STAGE DRIVER CIRCUITRY

FIELD OF THE INVENTION

The present invention is related to optical communications systems, and particularly to a method and apparatus for directly modulating a laser diode using multi-stage laser driver circuitry.

BACKGROUND

In optical communication systems, laser diodes are typically used to generate optical signals for transmission, and laser drivers are typically used to modulate the laser diodes.

One can encounter a number of problems when directly modulating a laser diode using a conventional laser driver IC (integrated circuit), particularly in the absence of cooling. First, ringing and distortion of the drive current waveform may result from one or more of wire bond inductance, laser diode capacitance, and laser driver output capacitance. Second, it may be difficult to keep the laser diode temperature low enough for adequate performance because of heat generated by the laser driver IC, which should be as close as possible to the laser diode in conventional systems in order to minimize the interconnect inductance that may contribute to the ringing stated above.

Therefore, it is desirable to provide a method and apparatus for interconnecting the laser driver to the laser diode that can reduce waveform distortion and ringing, while reducing the effect of the heat generated by the laser driver on the laser diode.

SUMMARY

In an exemplary embodiment according to the present invention, an optical transmitter is provided. The optical transmitter includes: a driver circuit capable of receiving data and applying the data to drive a laser diode; a transmission line having first and second ends, the first end being coupled to an output of the driver circuit; and an amplifier having a first terminal coupled to the second end of the transmission line and a second terminal coupled to the laser diode, wherein signal amplitude applied at the first terminal controls an optical output amplitude of the laser diode.

BRIEF DESCRIPTION OF THE DRAWINGS

These and other aspects of the invention may be understood by reference to the following detailed description, taken in conjunction with the accompanying drawings, wherein.

DETAILED DESCRIPTION

Figure 1:
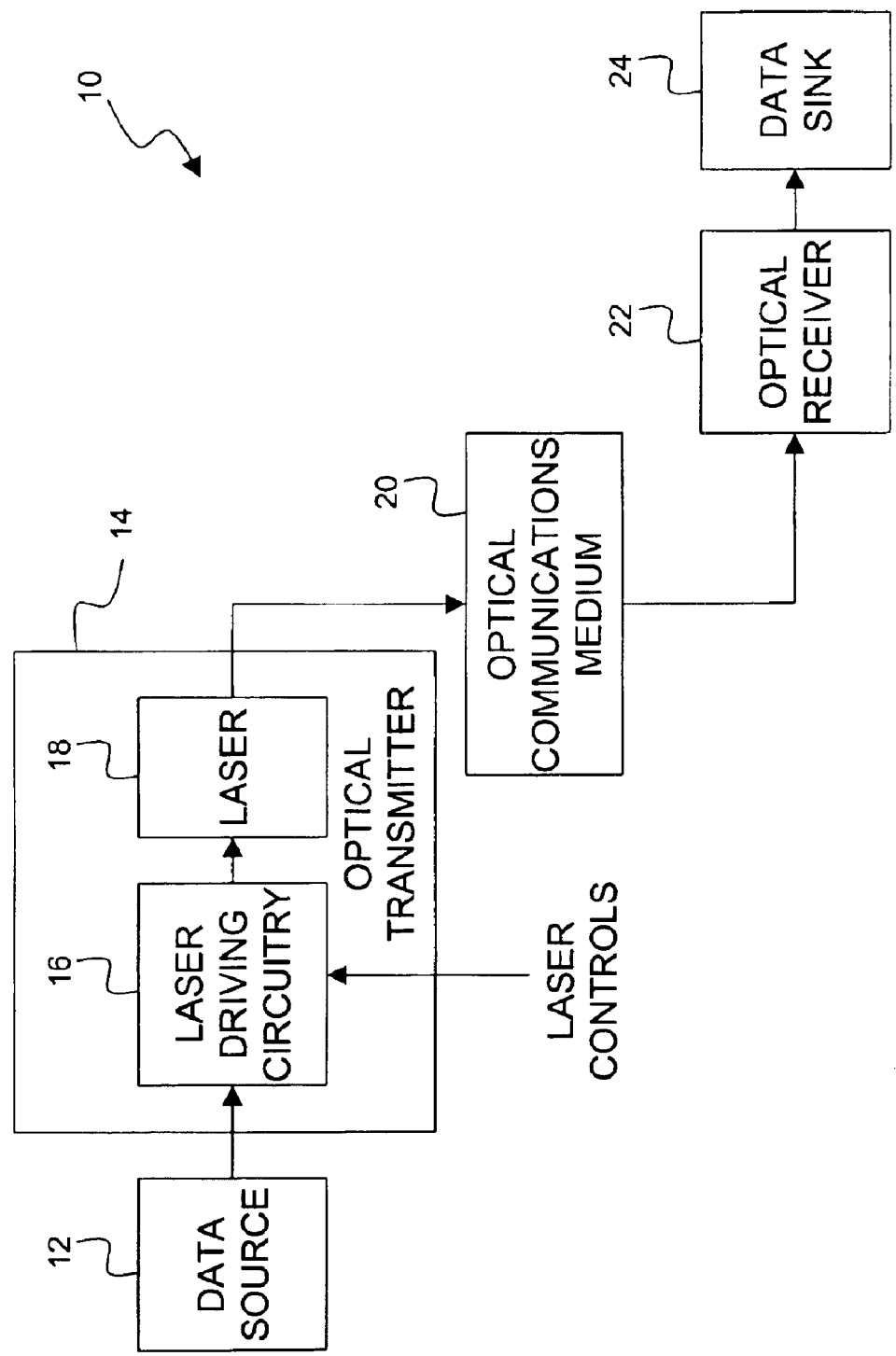
FIG. 1 is a block diagram of an optical communications system, in which an exemplary embodiment according to the present invention may be applied.

In an optical transmitter, if the laser driver IC is interconnected to the laser diode over a transmission line, the laser driver IC does not need to be close to the laser diode and heat generated by the laser driver IC does not affect the laser diode temperature as much as the case where, for example, the laser driver IC is wire bonded to the laser diode.

However, when a transmission line is used to interconnect the laser driver IC to the laser diode, impedance matching should typically be provided at both ends of the transmission line to prevent waveform distortion caused, e.g., by RF (radio frequency) reflections. If an impedance matching resistor is used in series with the laser diode, the voltage swing can be increased sufficiently to provide adequate modulation current.

However, with a modulation current of 80 mApp (milli amps, peak-to-peak), the voltage swing required to provide adequate modulation current in a 50Ω system would be 4.0 Vpp (voltage, peak-to-peak), and in a 25Ω system would be 2.0 Vpp. Such large voltage swings require increased laser driver IC supply voltages and increase overall system power dissipation. The modulation current of 80 mApp, for example, may be required at high temperatures. At room temperature, a typical modulation current may be between 40 mApp and 60 mApp. Further, bias current dissipated by the impedance matching resistor may add to power dissipation. The bias current typically varies with temperature, and may, for example, be between 10 mApp and 80 mApp.

In addition, it is generally necessary to back-terminate the laser driver IC with a matching impedance. This back termination can double the output current requirement for the laser driver. For example, in a 25Ω system with 80 mApp modulation required for the laser diode, the laser driver may have to supply 160 mApp if half of the modulation current is consumed in the back termination.

Therefore, the overall system power dissipation is increased both by the need for a higher drive voltage swing and by the need for a reverse termination at the laser driver. Since reducing system power dissipation is desirable in uncooled optical transmitter design, it may not be desirable to use the transmission line interconnect between the laser driver and the laser diode, unless a solution to reduce the power dissipation can be devised.

Instead of using a transmission line between the laser driver IC and the laser diode, the laser driver IC may be mounted as close as possible to the laser diode to minimize inductance. In this case, the heat generated by the laser driver IC should be tolerated by the laser diode. In this case where the laser diode and the laser driver IC are mounted very close to one another and coupled, for example, via wire bonding, a transmission line is not used. Hence, additional power dissipation (e.g., by impedance matching resistor(s)) associated with using transmission line interconnect can be avoided.

However, the resonance of the interconnect wire bond with the laser capacitance and driver output capacitance can cause ringing. This ringing may be exacerbated by the high output impedance of conventional laser driver circuits.

Conventional laser drivers are typically designed using a differential output stage with a current source connected to the emitters or sources of the output differential pair. The laser driver output is generally taken from the collector or drain of one of the output transistors, and the collector or drain of the other output transistor is typically terminated through a load resistor to AC ground. The output impedance of the laser driver, as seen by the laser diode looking into the collector or drain of the output transistor, is relatively high. This contrasts with the dynamic impedance of the laser diode itself, which is generally only a few ohms. However, high impedance drivers are generally used at all bit rates because of the ease of design of high speed differential stages, and because of the ease and accuracy of modulation current control afforded by the current source that sets the tail current of the differential pair.

However, the high output impedance of the driver does not load down or damp the ringing caused by wire bond inductance, which may become severe at high bit rates such as 10 Gbps (Giga bits per second). In order to reduce ringing, damping resistors may be used either in series between the laser diode and the laser driver, or in parallel with the driver output capacitance. A series resistor may have the detrimental affect of increasing the drive voltage requirement, and a parallel resistor may have the detrimental affect of increasing the drive current requirement. In both of these cases, the total power dissipation may be increased.

Further, heat generated by the laser driver IC may cause the temperature of the laser diode to rise because of the close proximity of the laser driver to the laser diode. Conventional laser drivers at 10 Gbps typically consume between 0.5 W (watts) and 1.5 W of power. In order to reduce the rise in temperature due to the heat generated by the laser driver IC, a very low thermal resistance packaging is often used, which increases system cost and size.

Another problem introduced by having the driver IC very close to the laser diode may come from passive components and multiple interconnects typically used to support driver operation. These components and interconnects may increase the size and complexity of the laser package, thereby increasing cost and reducing possibilities for miniaturization.

In an exemplary embodiment according to the present invention, a laser diode is directly modulated by a data signal. In this embodiment, laser driver circuitry is split into at least two separate stages separated by a length of electrical transmission line. A first stage, for example, may include a conventional laser driver. A second stage, for example, may include a transistor configured as an emitter follower or a source follower, which is implemented between the laser driver and the laser diode in an optical transmitter.

This exemplary embodiment provides for reduced power supply voltage and power dissipation as compared to an optical transmitter where a laser diode is driven over a transmission line between the laser driver IC and the laser diode without a use of such additional stage for laser driving. This reduction to required voltage and power can be attributed at least partly to the absence of using impedance matching resistor(s) between the laser driver IC and the laser diode.

Since a transmission line interconnect is used between the laser driver IC and the laser diode in the described embodiment, power dissipation and associated localized heating in the immediate vicinity of the laser diode can be reduced as compared to an optical transmitter having a conventional laser driver IC mounted very close to the laser diode. In addition, reduction to laser diode drive current ringing and distortion caused by interconnect inductance between the laser diode and laser driver can also be realized. Further, by using the transmission line interconnect, the number of passive components and number of electrical connections used inside the laser package can be reduced as compared to the case of having a conventional laser driver IC co-packaged with the laser diode.

FIG. 1 is a block diagram of an optical communications system 10, in which an exemplary embodiment according to the present invention may be applied. The optical communications system 10 illustrates a system with an optical transmitter 14 at the transmission end of an optical communications medium 20 and an optical receiver 22 at the receiving end. However, those skilled in the art would appreciate that practical communications systems may have one or more optical transmitters as well as one or more optical receivers at each end of the optical communications medium. The optical communications medium 20 may comprise a fiber optic cable.

The optical communications system 10 includes a data source 12, which provides data for modulating the laser output for optical transmission. The data from the data source 12 may be encoded, for example, via forward error correction (FEC), for data detection and/or recovery at the receiving end. For example, the data may be provided as a high data rate (e.g., 10 Gbps or higher) Rf (radio frequency) signal. The data source, for example, may be coupled to a computer network for generating the data and providing the same to the data source 12.

The optical transmitter 14 includes laser driving circuitry 16 and a laser 18. The laser driving circuitry may be multi-stage, and may receive one or more control signals for controlling various different parameters of the laser output, such as, for example, modulation amplitude and bias. The laser 18 may be a laser diode or any other optical source suitable for optical communications. It should be noted that the laser driver 16 (or a portion thereof) and the laser 18 may be packaged separately, and be coupled over a length of transmission line in an exemplary embodiment according to the present invention.

The transmission line, for example, may be co-planar or include a micro strip, and may be implemented on a circuit board and/or a flex circuit. For example, the laser 18 and a stage of the multi-stage laser driving circuitry 16 may be included in a TO (transistor outline) can or other suitable laser package, and coupled to the remaining one or more stages of the laser driving circuitry 16 on a circuit board over a transmission line, which may be on the circuit board and/or the flex circuit.

The optical communications system 10 includes the optical receiver 22 and a data sink 24 at the receiving end of the optical communications medium 20. The optical receiver 22, for example, may include one or more photodiodes for detecting the received optical signals and converting the optical signals to electrical signals. The data sink 24 may include a decoder for decoding the data encoded at the transmission end. The data sink 24, for example, may be coupled to a computer network for distributing and/or processing the received data.

Figure 2:
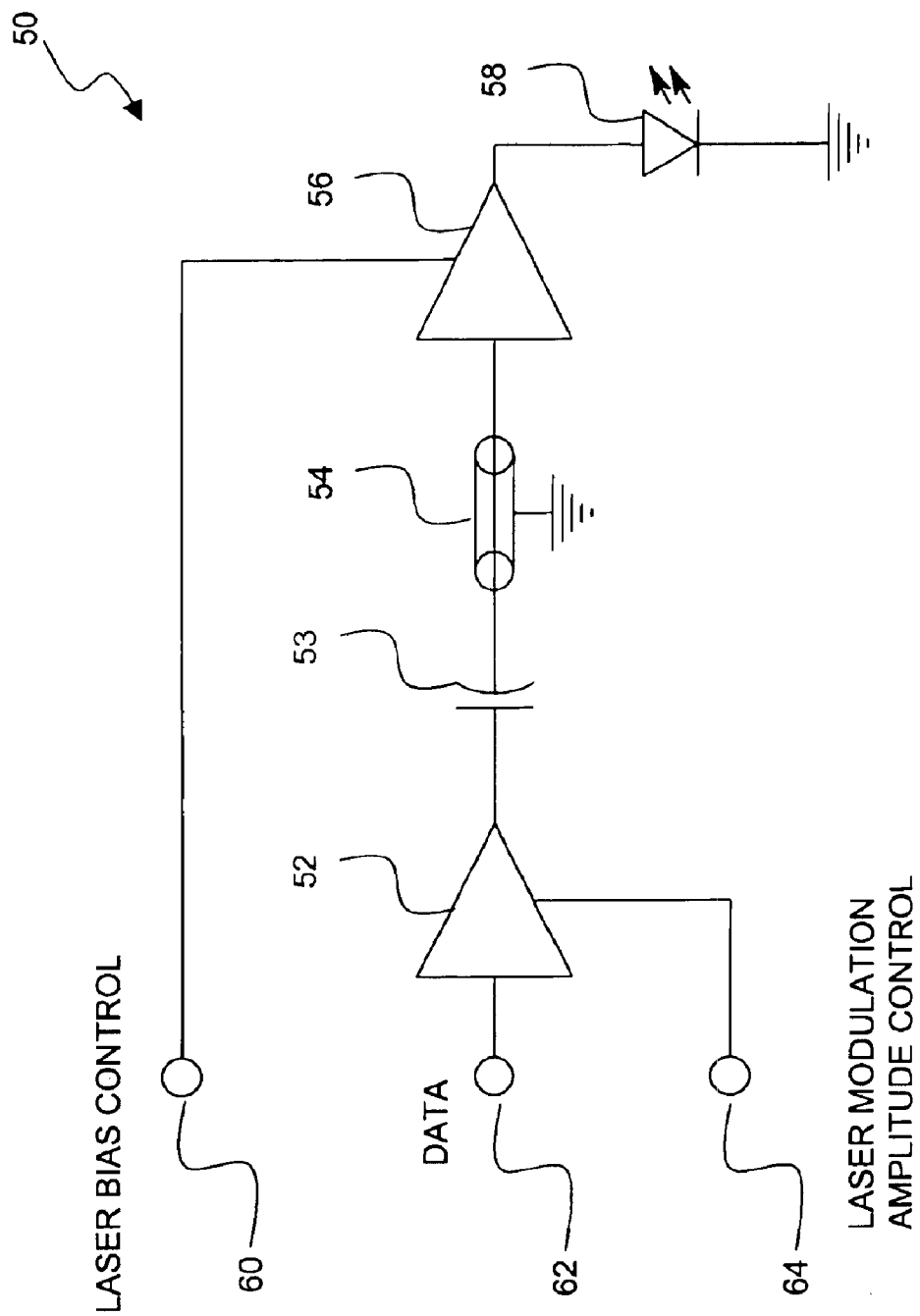
FIG. 2 is a schematic diagram of an optical transmitter in an exemplary embodiment according to the present invention.

FIG. 2 is a schematic diagram of an optical transmitter 50 in an exemplary embodiment according to the present invention. For example, the optical transmitter 50 may be used as the optical transmitter 14 of FIG. 1 in the exemplary optical communications system.

The optical transmitter 50 includes a laser driver 52 having variable output amplitude. The output of the laser driver 52 is applied at the input of an amplifier 56 through a capacitor 53 and over a transmission line 54. The amplifier 56, for example, may be a fixed gain linear amplifier (e.g., a fixed AC gain linear buffer amplifier), and may have variable DC output current. The output of the amplifier 56 is applied at the input of a laser diode 58, which in turn generates laser output corresponding to the output amplitude of the amplifier 56.

In the exemplary optical transmitter of FIG. 2, the laser driver 52 directly modulates the laser diode 56 with a data signal 62. The laser driver circuitry is split into at least two separate stages separated by a length of the transmission line 54. The laser driver 52 is the first stage that generates a digital output that switches between two voltage levels V0 and V1 corresponding to whether the input data consists of a "zero" or a "one". The voltage levels V0 and V1 may be determined by a laser modulation amplitude control signal 64, which may allow the correct modulation amplitude to be applied to the laser diode 56 to maintain its desired operating point and extinction ratio (ratio between the optical "one" and "zero" levels).

The output from the laser driver 52 is coupled via a DC-blocking capacitor 53 to the transmission line 54 and thence to the amplifier 56. In other embodiments, the capacitor 53 may not be used. The amplifier 56 may be a constant gain, linear amplifier that serves to provide impedance matching to the impedance of transmission line 54 and also provide current gain prior to driving the laser diode 58, as the dynamic impedance of a typical edge-emitting laser diode is in the range of 5 to 10 Ohms, whereas the impedance of typical transmission lines is in the range of 25 to 50 Ohms. The amplifier 56 may also provide a DC bias current to the laser diode 58, which may typically be controlled by a laser bias control signal 60, which may be adjusted to maintain a constant optical output power level.

A fixed-gain linear amplifier can generally be very simple, possibly only a single transistor. Hence, fixed-gain linear amplifiers can operate with lower voltages and currents than conventional laser drivers currently in use. These lower voltages and currents allow for low added power dissipation in the vicinity of the laser diode. This low added power dissipation may simplify laser package design, as provision of adequate heat sinking to maintain low laser diode operating temperature is one of the major design challenges for products such as 10 Gb/s (giga bits per second) optical transceivers and transponders. In addition, reduced operating voltage may allow for reduction in laser driver supply voltage. This potentially reduces or eliminates a need for providing higher supply voltage, which is commonly required by conventional transceiver or transponder circuitry.

Further, a fixed-gain linear amplifier can be very simple and may require very little space and few electrical connections. It can be co-packaged with the laser diode in a small, low-cost package such as a TO can. In addition, the fixed gain linear amplifier can be realized using a single-transistor common drain or common collector stage. These and other single-transistor configurations may provide low input capacitance, which would provide high frequency impedance matching to the transmission line 54. They may also provide current gain to reduce the drive voltage needed from the laser driver 52.

Further, they may provide low output impedance, which would help to damp ringing in the electrical drive signal provided to the laser diode 58. The ringing, for example, may result from one or more of the output capacitance of the amplifier 56, the parasitic capacitance of the laser diode 58, and the parasitic inductance between the amplifier 56 and the laser diode 58.

In another exemplary embodiment, an additional amplifier may be added between the laser driver 52 and the capacitor 53. The additional amplifier, for example, may be a fixed gain inverting linear amplifier. The additional amplifier may be useful when the optical transmitter employs a "dual loop" control circuit configuration (i.e. a constant extinction ratio control loop as well as the standard constant optical power control loop). Such "dual loop" control circuits often employ a small-amplitude, low frequency dither-tone modulation of the "ones"-level laser drive current which is then sensed by a monitor photodiode and used to estimate the modulation slope efficiency of the laser diode. The estimated modulation slope efficiency may then be used to adjust the laser modulation amplitude to maintain a constant extinction ratio.

Modulation of the "ones" level current may be accomplished by modulating the tail current of a differential pair of high-speed bipolar or N-channel FET transistors that form the output stage of the driver. If one of the differential outputs of such a driver is directly coupled to a laser diode, then low-frequency dither-tone modulation of only the optical "ones" level may be accomplished. It may be undesirable to modulate the "zeros" level because this level is close to the diode's lasing threshold and modulation near this point may result in high levels of turn-on jitter.

Further, a problem may arise if a linear buffer amplifier such as those described previously is employed between a dual-loop digital driver and a laser diode. The problem comes from the inversion of the "one" and "zero" levels, such that the dither tone modulation from a typical dual-loop driver would show up on the "zeros" level rather than the "ones" level. This problem can be rectified if the additional amplifier (e.g., inverting linear amplifier) is employed between the dual-loop laser driver 52 and the amplifier 56 that is connected to the laser diode. The inverting amplifier may be integrated into either the laser driver 52 or the additional amplifier, but in order to minimize power dissipation close to the laser diode, it may be more desirable to integrate it with the laser driver 52.

In other embodiments, a monitor photodiode may be used to monitor the output of the laser diode 58. The monitored signal may be used as a feedback signal to control laser modulation and/or bias. The monitor photodiode, for example, may be implemented in the same TO can as the laser diode 58 and/or the amplifier 56.

Figure 3:
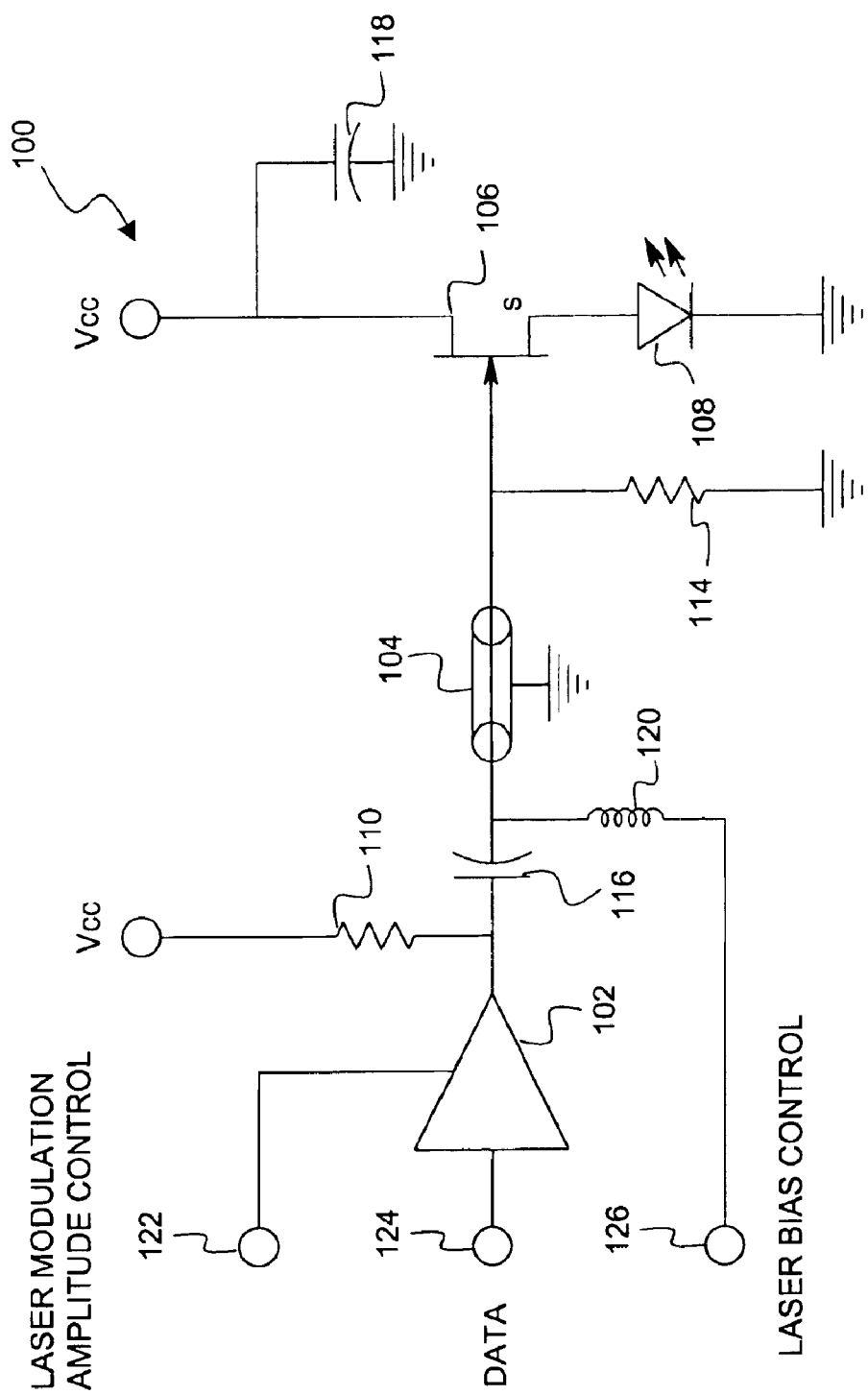
FIG. 3 is a schematic diagram of an optical transmitter in another exemplary embodiment according to the present invention.

FIG. 3 is a schematic diagram of an optical transmitter 100 in an exemplary embodiment according to the present invention. For example, the optical transmitter 100 may be used as the optical transmitter 14 of FIG. 1 in the exemplary optical communications system. In the optical transmitter 100, the amplifier is implemented using a single FET (field effect transistor) (e.g., PHEMT (pseudomorphic high electron mobility transistor)) configured as a DC-coupled common drain amplifier. In other embodiments, a bipolar transistor (e.g., an NPN bipolar transistor) may be used as a common collector amplifier. In still other embodiments, other transistors known to those skilled in the art may be used.

The optical transmitter 100 includes a laser driver 102 and a laser diode 108. The laser driver 102 receives data 124, and uses this data to modulate the laser diode 108. The data 124, for example, may have a data rate of 10 Gbps or higher. The laser driver 102 also receives a laser modulation amplitude control input 122, which can be used to control the peak-to-peak amplitude of the laser diode output.

In the exemplary embodiment, the laser driver 102 drives a transistor 106 through a length of transmission line 104. The transmission line 104 may be implemented on a circuit board and/or a flex circuit as a co-planar transmission line or a micro strip. The length of the transmission line 104 may be on the order of 1.25 cm (centimeter), and may vary between approximately 0.25 cm to a few centimeters. A capacitor 118 is placed between the drain of the transistor 106 and ground.

The capacitor 118 may include two capacitors in parallel, one with small capacitance (e.g., 60 to 100 pf) in the TO can of the laser diode 108, and one with larger capacitance (e.g., 0.1 µf) outside the TO can.

The optical transmitter 100 further includes a load resistor 110, which provides a DC (direct current) load for the laser driver 102. The load resistor 110 also provides a reverse termination for the transmission line 104, thereby enabling a substantial matching between an output impedance of the laser driver 102 and the characteristic impedance of the transmission line 104. In the optical transmitter 100, a capacitor 116 and an inductor 120 form a bias tee network, so that DC bias control of the transistor 106, and thereby of the laser diode 108 can be achieved through a laser bias control signal 126 applied to the gate of the transistor 106 through the transmission line 104 and the inductor 120. The capacitor 116 provides DC blocking to isolate the output of the laser driver 102 from the laser bias control signal 126.

An impedance matching resistor 114 should be selected such that it provides the required terminating impedance for the transmission line 104, thereby enabling a substantial matching between an input impedance of the transistor 106 and the characteristic impedance of the transmission line 104. Those skilled in the art would appreciate the values for various different electrical circuit components, such as, capacitors, resistors and inductors, for proper impedance matching and operation of the optical transmitter circuitry.

The transistor 106, which may be replaced by an NPN bipolar transistor configured as an emitter follower, provides a relatively high input impedance which does not load down the output of the transmission line 104. An output from the transistor's source or emitter, which is connected to the laser diode 108, provides a low impedance drive signal for the laser diode 108, which may damp ringing created by parasitic inductance between the transistor 106 and the laser diode 108. This way, one of the difficulties (i.e., ringing) with previous implementations of driver and laser diode interconnection can be resolved.

The exemplary embodiment results in a reduction to the required supply voltage Vcc because no resistor is used in series with the laser diode 106. The worst case peak voltage across the laser diode 106 under maximum current conditions, for example, may be as high a 2.0V. If the supply voltage Vcc is 3.3V, for example, there would be 1.3V remaining as the collector-to-emitter voltage for the transistor 106, which is adequate for an acceptable transistor operation.

Further, with a typical laser dynamic impedance of 7Ω and a worst-case modulation current of 80 mApp (milli-amps peak-to-peak), the AC voltage swing at the anode (coupled to the emitter of the transistor 106) of the laser diode 108 is 0.56 Vpp. For a typical single-transistor follower voltage gain of 0.5, the output voltage swing required from the laser driver 102 is then 1.12 Vpp. This voltage swing is much less than the 2.0 Vpp or 4.0 Vpp needed for the case where, for example, the laser diode 108 were driven directly over the transmission line 104 through an impedance-matching resistor without using a transistor.

Therefore, the reduced voltage swing required from the laser driver 102 plus the low Vcc requirement of the follower stage make it possible to design an uncooled optical transmitter with lower supply voltage and hence reduced overall power dissipation compared to the case where the laser diode is driven directly from a transmission line via the impedance matching resistor.

Further, compared to having the laser driver IC very close to the laser diode, the power dissipation and hence heating close to the laser diode is reduced as well. For example, a conventional differential driver supplying 80 mApp of modulation current to the laser and operating from a supply voltage of 3.3V would result in a power dissipation of 80 mA×3.3 V=264 mW from just the modulation current alone. A typical driver would add an additional few hundreds of milli-watts for additional internal gain stages and other functions.

For the same modulation current of 80 mApp, the average power dissipation with the transistor of the described embodiment is only 40 mA×3.3 V=132 mW because the modulation current is zero half of the time. The single-ended nature of the follower driver halves the modulation-associated power dissipation that is in close proximity to the laser diode 108. In addition, the laser driver 102 can be located remotely from the laser diode 108 to minimize its heating effect.

An added benefit is that because the required current swing from the laser driver 102 is reduced, there are additional power savings. For example, to achieve the needed 1.12 Vpp drive for the transistor 106 when driving a 50Ω load plus a 50Ω reverse-terminating resistor, the driver current needed is 1.12V/25Ω=44.8 mA. The modulation-associated power dissipation of the laser driver 102 is then 44.8 mA×3.3V=147.8 mW. The total modulation-associated power dissipation of the transistor 106 plus the laser driver 102 is then 147.8 mW+132 mW=279.8 mW, which is only slightly more than the power of 264 mW required if the laser driver 102 drove the laser diode 106 directly.

Therefore, with virtually no increase in total power dissipation, the transistor 106 can be used to substantially reduce the power dissipation in the immediate vicinity of the laser diode. This reduced power dissipation can greatly simplify the thermal design and cost of the laser package. In addition, because the transistor 106 requires very few passive components and external connections, it can be co-packaged with the laser diode 108 in a very small housing with a small number of external electrical connections. In other embodiments, a resistor may be added between Vcc and the drain of the transistor 106 so as to reduce power dissipation at the laser diode (e.g., in the TO can).

In another exemplary embodiment, an additional inductor may be coupled to the source of the transistor 106 to provide a path for laser diode bias current in addition to the DC current provided by the transistor 106. The other end of the additional inductor may be coupled to a laser bias control signal. Using this configuration, the DC current to be delivered by the transistor 106 may be lowered. Hence, the overall power dissipation and associated heating in the neighborhood of the laser diode 108 may be lowered.

Additionally a capacitor may be added between the additional inductor and the source of the transistor 106. Further, another inductor may be placed between the source of the transistor and ground. This way, the DC voltage drops across the transistor 106 and the laser diode 108 are not added in series, so that each device may have a full supply voltage available for its individual operation. This configuration may be useful in designs where supply voltages are reduced, for example, to 1.8V or 1.2V (from 3.3V for example), which may not provide enough operating voltage if the transistor 106 and the laser diode 108 were directly connected in series.

In another exemplary embodiment, an impedance matching resistor may be added between the base of the transistor 106 (e.g., NPN bipolar transistor in common collector amplifier configuration) to the positive supply voltage Vcc, which may be 3.3V. In this case, the impedance matching resistor and the resistor 114 should be chosen such that their parallel combination enables substantial matching between an input impedance of the transistor 106 and the characteristic impedance of the transmission line 104. By using two impedance matching resistors, their values may be higher than if only a single terminating resistor (e.g., resistor 114) were used. Hence, they would draw lower current for a given base voltage, which may translate into a reduction in overall power dissipation.

Further, in yet another exemplary embodiment, the transistor 106 may be replaced by an NPN bipolar transistor configured as a common emitter amplifier rather than a common collector amplifier. In other words, the laser diode 108 may be placed between the positive power supply Vcc and the collector of the NPN bipolar transistor rather than between the emitter of the NPN bipolar transistor and ground. This way, lower drive voltage may be used for the same laser modulation current swing. However, it may result in a higher effective input capacitance for a given transistor, and of high output impedance which may limit its ability to damp ringing of the laser diode drive current waveform. When the FET (e.g., PHEMT) is used, the transistor 106 may also have a common source configuration.

Figure 4:
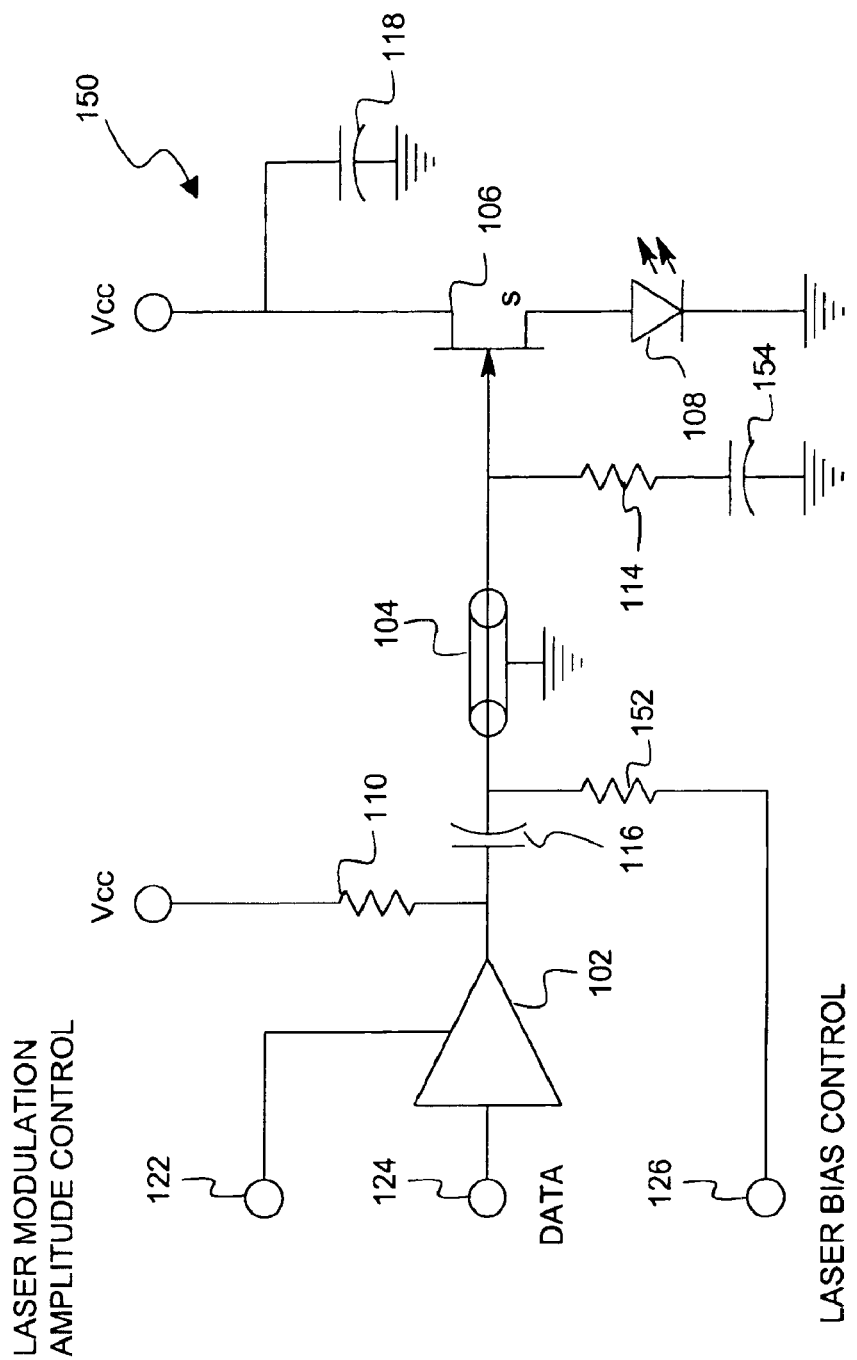
FIG. 4 is a schematic diagram of an optical transmitter in yet another exemplary embodiment according to the present invention.

The optical transmitter 150 of FIG. 4 is identical to that of the optical transmitter 100 of FIG. 3, except that a capacitor 154 is connected in series with resistor 114, and the inductor 120 is replaced with a resistor 152. The addition of the capacitor 154 allows the circuit node at the gate of the transistor 106 to have a high DC impedance to ground. Hence there is only a small current required from the laser bias control circuit and the inductor 120 can be replaced by the resistor 152.

Elimination of the inductor 120 allows for improved high frequency performance because practical inductors generally have large parasitic capacitance that limits the range of frequencies over which they present a high impedance to the transmission line 104. A resistor can provide a high impedance over a much wider frequency range than an inductor, hence allows for a simpler and less expensive design.

As is the case for the optical transmitter 100 of FIG. 3, the transistor 106 of the optical transmitter 150 may be replaced by a bipolar transistor (e.g., NPN bipolar transistor) or any other suitable transistor known to those skilled in the art.

In another exemplary embodiment, the optical transmitter 150 of FIG. 4 may include additional components. For example, a resistance may be added in parallel to the capacitor 154, i.e., from a node between the resistor 114 and the capacitor 154 to ground. Further, a parallel resistor and capacitor (a parallel RC network) may be added between the capacitor 116 and the transmission line 104. This way, the capacitor 154 may have a smaller value, and hence a smaller physical size, than for the configuration in FIG. 4.

For example, for the optical transmitter 150 in FIG. 4, the capacitor 154 may have a typical value of 0.1 $\mu$f (micro farad). With the addition of the aforementioned capacitor and the resistors, the capacitor 154 may have a value of 100 pf (pico farad). With typically limited space available in a laser package such as a TO can, this difference in capacitor size may be helpful in implementing a practical design.

For example, the parallel RC network between the capacitor 116 and the transmission line 104 may provide equalization to maintain an overall flat frequency response even though the capacitor 154 has only a small value. The resistor in parallel to the capacitor 154 should be chosen to have a sufficiently high value that a resistor 152 may still be used rather than an inductor. Flat frequency response may be maintained if the resistor in the parallel RC network is chosen to be equal in resistance to the resistor in parallel to the capacitor 154 and the capacitor in the parallel RC network is chosen to be equal in capacitance to the capacitor 154.

As is the case for the optical transmitter 150 of FIG. 4, the transistor may be replaced by a bipolar transistor (e.g., NPN bipolar transistor) or any other suitable transistor known to those skilled in the art.

Although this invention has been described in certain specific exemplary embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents.

What is claimed are:

1. An optical transmitter comprising:
   a driver circuit capable of receiving data and applying the data to drive a laser diode;
   a transmission line having first and second ends, the first end being coupled to an output of the driver circuit;
   an amplifier having a first terminal coupled to the second end of the transmission line and a second terminal coupled to the laser diode, wherein signal amplitude applied at the first terminal controls an optical output amplitude of the laser diode;
   a first resistor disposed between the first end of the transmission line and positive voltage supply; and
   a second resistor disposed between the second end of the transmission line and ground, wherein the first and second resistors, respectively, enable a substantial matching of an output impedance of the driver circuit and an input impedance of the amplifier to the characteristic impedance of the transmission line.

2. The optical transmitter of claim 1, wherein the amplifier comprises a transistor.

3. The optical transmitter of claim 1, wherein the amplifier comprises a bipolar transistor configured as a common collector amplifier.

4. The optical transmitter of claim 1, wherein the amplifier comprises a bipolar transistor configured as a common emitter amplifier.

5. The optical transmitter of claim 1, wherein the amplifier comprises a FET configured as a common drain amplifier.

6. The optical transmitter of claim 5, wherein the FET comprises a PHEMT.

7. The optical transmitter of claim 1, wherein the amplifier comprises a FET configured as a common source amplifier.

8. The optical transmitter of claim 7, wherein the FET comprises a PHEMT.

9. The optical transmitter of claim 1, wherein the transmission line is selected from a group consisting of a co-planar transmission line and a micro strip.

10. The optical transmitter of claim 1, wherein the driver circuit is not in a same package as the laser diode, whereby heat dissipation near laser diode is reduced.

11. The optical transmitter of claim 1, further comprising a third resistor disposed between the second end of the transmission line and the positive voltage supply, wherein a parallel combination between the second and third resistors enables said substantial matching between the characteristic impedance of the transmission line and the input impedance of the amplifier.

12. The optical transmitter of claim 1, further comprising an AC coupling capacitor in series with the second resistor, whereby reducing power dissipation and improving frequency performance.

* * * * *